United States Patent
Luo et al.

(10) Patent No.: US 9,344,081 B2
(45) Date of Patent: May 17, 2016

(54) LINE DRIVER WITH SEPARATE PRE-DRIVER FOR FEED-THROUGH CAPACITANCE

(71) Applicant: Lattice Semiconductor Corporation, Portland, OR (US)

(72) Inventors: Kexin Luo, Shanghai (CN); Fangqing Chu, Shanghai (CN); Huaizhou Yang, Shanghai (CN); Yu Shen, Shanghai (CN); Inyeol Lee, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 14/123,037

(22) PCT Filed: Mar. 15, 2013

(86) PCT No.: PCT/CN2013/072710
§ 371 (c)(1),
(2) Date: Nov. 27, 2013

(87) PCT Pub. No.: WO2014/139151
PCT Pub. Date: Sep. 18, 2014

(65) Prior Publication Data
US 2015/0222261 A1    Aug. 6, 2015

(51) Int. Cl.
*H03K 17/56* (2006.01)
*H04L 25/02* (2006.01)

(52) U.S. Cl.
CPC ............ *H03K 17/56* (2013.01); *H04L 25/0272* (2013.01)

(58) Field of Classification Search
CPC ....... H03K 19/094; H03K 19/086; H03F 3/45
USPC ........................ 327/108, 109, 110, 111, 112
See application file for complete search history.

(56) References Cited

U.S. PATENT DOCUMENTS

| | | | |
|---|---|---|---|
| 5,825,819 A | 10/1998 | Cogburn | |
| 5,959,492 A * | 9/1999 | Khoury et al. | 327/389 |
| 7,969,195 B1 * | 6/2011 | Fortin et al. | 326/83 |
| 2005/0127998 A1 | 6/2005 | Maekawa et al. | |
| 2008/0048736 A1* | 2/2008 | Ruy | 327/108 |
| 2009/0115519 A1* | 5/2009 | Ishiguro | 330/255 |

FOREIGN PATENT DOCUMENTS

| | | |
|---|---|---|
| JP | 2005-175811 A | 6/2005 |
| JP | 2006-295642 A | 10/2006 |

OTHER PUBLICATIONS

PCT International Search Report, PCT Application No. PCT/CN2013/072710, Dec. 19, 2013, 9 pages.

* cited by examiner

*Primary Examiner* — John Poos
(74) *Attorney, Agent, or Firm* — Fenwick & West LLP

(57) ABSTRACT

Embodiments of the invention are generally directed to a line driver with separate pre-driver for feed-through capacitance. An embodiment of an apparatus includes a differential pair of transistors to generate an output signal on a first output node and a second output node; a pass-through capacitance coupled with the first output node and the second output node; a first pre-driver to drive an input signal for the differential transistors; and a second pre-driver to drive the input signal for the pass-through capacitance.

18 Claims, 8 Drawing Sheets

LINE DRIVER WITH SEPARATE PRE-DRIVER FOR FEED-THROUGH CAPACITANCE

TECHNICAL FIELD

Embodiments of the invention generally relate to the field of data transmission, and, more particularly, a line driver with separate pre-driver for feed-through capacitance.

BACKGROUND

For high-speed transmission of signals, parallel data may be serialized for transmission as high-speed serial data and then deserialized upon receipt to return such data to parallel form. An interface for such operation is commonly referred to as a SerDes (Serializer/Deserializer), including a parallel to serial convertor and serial to parallel converter.

However, as the SerDes speed increases, the high-speed data rate will generate ISI (Inter-Signal Interference), thus limiting speed of operation of the interface. In most cases, the line driver is the main bottleneck blocking increased speed of transmission, with the issues arising at least in part because of heavy loading at the line driver output.

The loading on the line driver may include capacitance of the driver itself, ESD (Electro-Static Discharge) capacitance, package capacitance, PCB (printed circuit board) trace capacitance, and common choke parasitic capacitance. The result of such loading is that the line driver becomes bandwidth limited, and thereby limits the operation of the serial interface.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Embodiments of the invention are generally directed to a line driver with separate pre-driver for feed-through capacitance.

In a first aspect of the invention, an embodiment of an apparatus includes a differential pair of transistors to generate an output signal on a first output node and a second output node, and a pass-through capacitance coupled with the first output node and the second output node. The apparatus includes a first pre-driver to drive an input signal for the differential transistors, and a second pre-driver to drive the input signal for the pass-through capacitance.

DETAILED DESCRIPTION

Embodiments of the invention are generally directed to a line driver with separate pre-driver for feed-through capacitance.

As SerDes speed increases, ISI increases, and a line driver may be limited in data rate because the heavy loading at the line driver output, including the driver itself, ESD (Electro-Static Discharge), package, PCB (Printed Circuit Board) trace, and common choke parasitic capacitance, combine to make the line driver become increasingly bandwidth limited.

In general, the solutions used to address the ISI problem for a line driver are to increase the bandwidth of the line driver, or to decrease the rise/fall time of the driver. In conventional circuits, a feed-through capacitance technique may be utilized in a line driver. A feed-through technique (also referred to as a negative-C technique) is a general technique to decrease the rise/fall time of the line driver. In a conventional circuit, a pre-driver operates to drive a signal both for signal input and for the feed-through capacitance.

In some embodiments, a line driver includes a separate pre-driver for feed-through capacitance, thus allowing for separate design of the pre-driver for the feed-through capacitance. In some embodiments, a driver may be structured as a timing controlled cascade feed-through high-speed line driver, wherein the timing of input signals to the pre-driver for the feed-through capacitance is controlled in relation to the timing of input signals to the pre-driver for the differential pair transistors.

Figure 1:
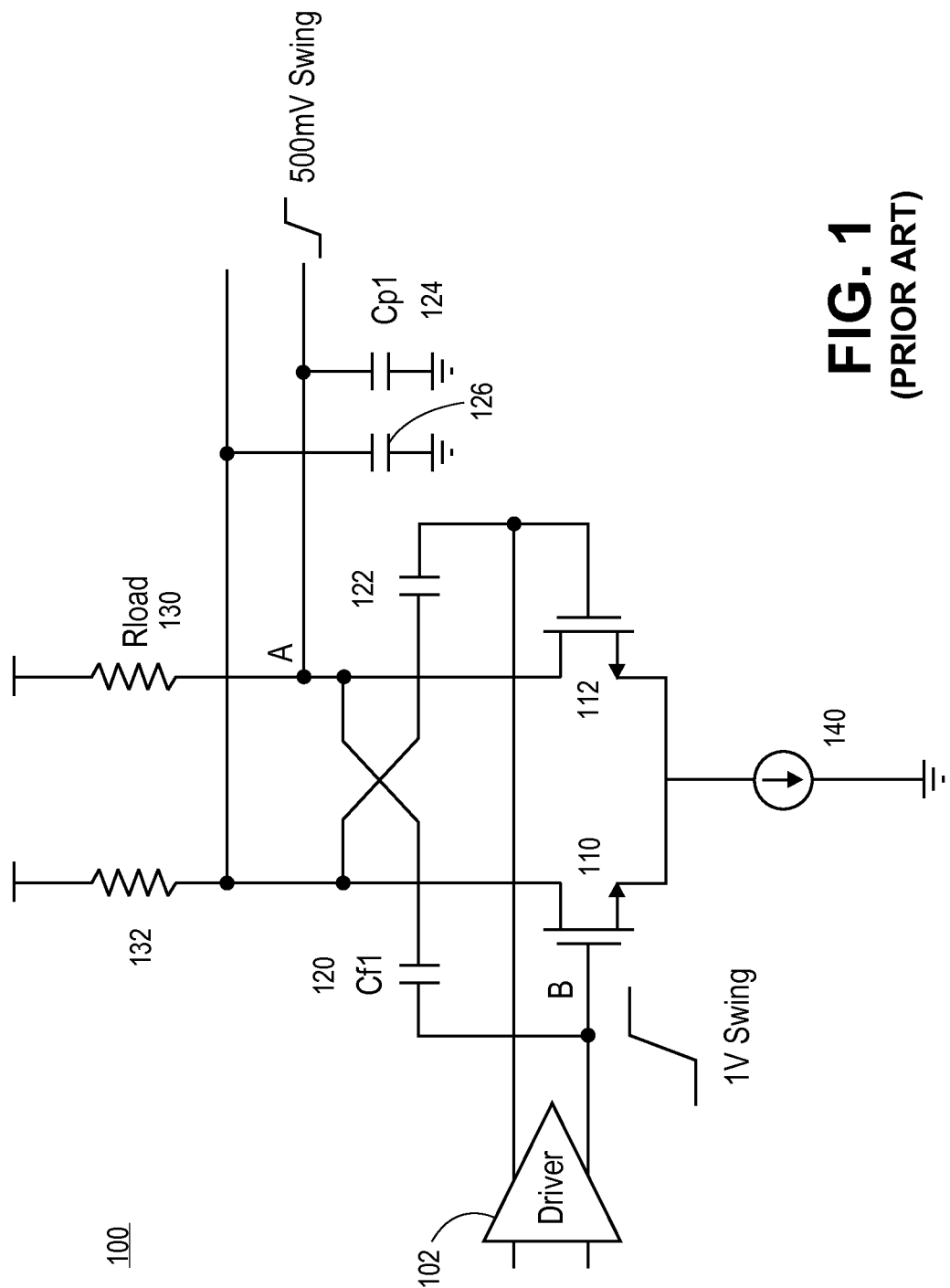
FIG. 1 illustrates a conventional feed-through capacitance driver circuit.

FIG. 1 illustrates a conventional feed-through capacitance driver circuit. In this illustration, a circuit 100 includes a pre-driver 102 driving a differential signal into the gates of differential pair transistors 110 (at node B with a voltage swing of 1.0 volts) and 112, the transistors in this implementation being NMOS (N-Channel Metal Oxide Semiconductor) transistors. Further, the pre-driver drives the signal on capacitors 120 (Cf1) 120 and 122. In the circuit 100, node B input is coupled with a first terminal of capacitor 120 and the gate of transistor 110, with the other input at the gate of transistor 112 coupled with a first terminal of capacitor 122. A second terminal of capacitor 120 is coupled with the drain terminal of transistor 112 and to load resistor 130 (Rload) at Node A, and similarly a second terminal of capacitor 122 is coupled with the drain terminal of transistor 110 and resistor 132. As shown, Node A at resistor 130 is illustrated as being coupled with a capacitance 124 (Cp1), with resistor 132 being illustrated as being coupled with capacitance 126. Also illustrated is current source 140 coupled with the source terminal of each of transistors 110 and 112.

In this illustration, capacitances 124 and 126 represent the loading parasitic capacitance at the output nodes, with the voltage swing at Node B being 500 mV. In the illustrated driver circuit 100, capacitors 120 and 122 are utilized as the feed-through capacitance, with being driven by the pre-amplifier 105. The swing of pre-amplifier at Node B is 1000 mV.

In this illustration, the charge transferring of the node A is as follows:

$$\text{Transferred Charge} = 500\ mV * Cp1 + (-1V + 500\ mV) * Cf1$$

Thus, the Cf1 acts as a negative capacitance in the circuit, which thus reduces the loading parasitic capacitance.

In the conventional feed-through technique, a single pre-driver 102 is used to drive both the differential pair and the feed-through capacitors. However, the conventional feed-through line driver circuit 100 thus does not address differences between signal operation at the differential pair and the pass-through capacitors.

In some embodiments, in contrast to the circuit illustrated in FIG. 1, a feed-through line driver circuit includes separate pre-drivers that are utilized to drive the feed-through capacitance and differential-pair transistors, with a first pre-driver to driver the differential pair transistors and a second pre-driver to drive the feed-through capacitance, respectively. Because the feed-through capacitance and the differential-pair transistors are different regarding the loading for the pre-driver, it is advantageous to use separate pre-drivers, where the separation of pre-drivers allows for optimizing each pre-driver independently.

Figure 2:
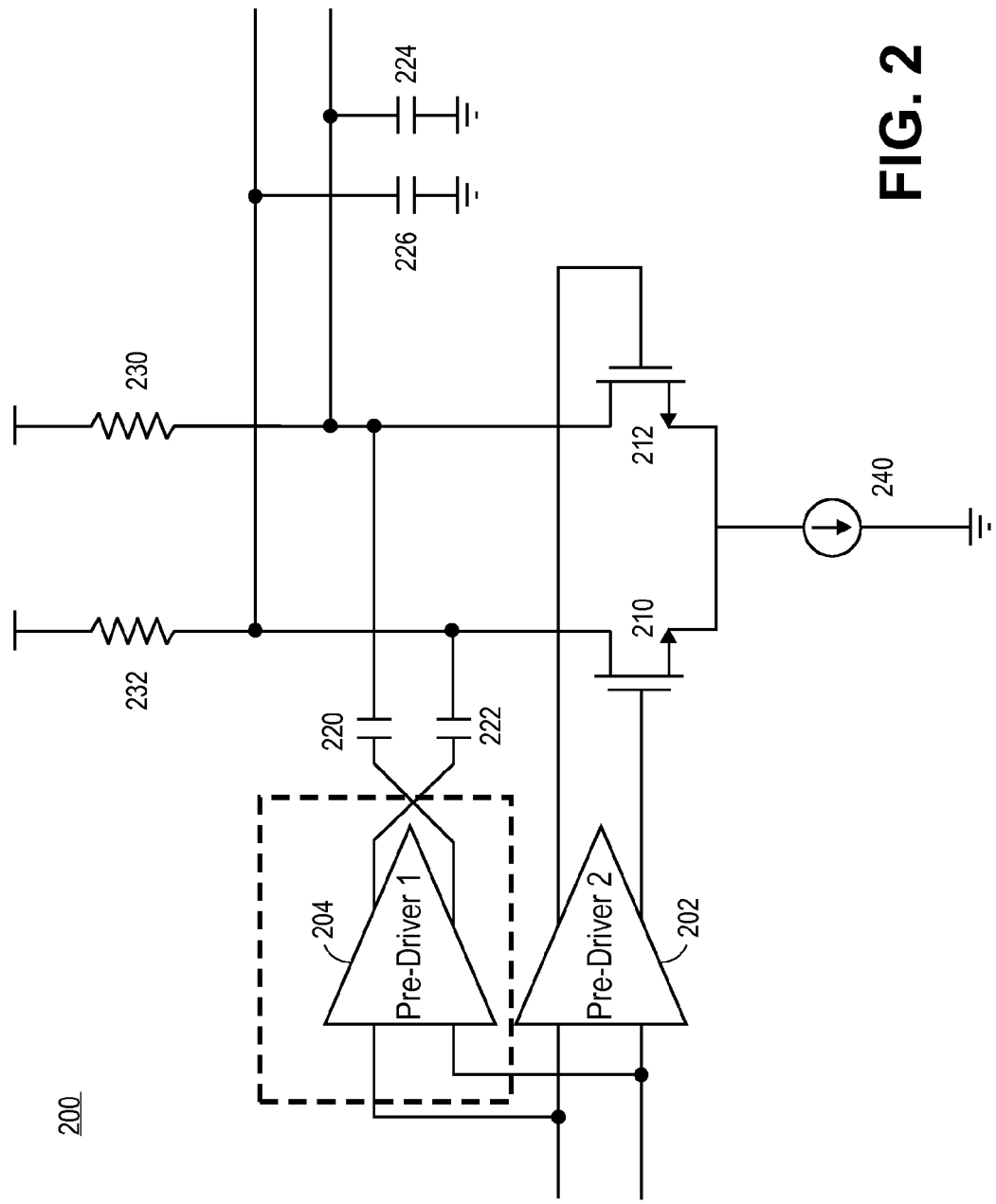
FIG. 2 illustrates an embodiment of a feed-through capacitance line driver.

FIG. 2 illustrates an embodiment of a feed-through capacitance line driver. In some embodiments, in order to counter the effect of feed-through capacitors providing heavy loading for the associated pre-driver, feed-through capacitance operation is modified to include a separate pre-driver to increase the driving capacity of the line driver.

In some embodiments, a driver circuit 200 includes a first pre-driver 202 driving a differential signal into the gates of differential pair transistors 210 and 212, the transistors in this implementation being NMOS transistors, with a first output of pre-driver 202 being coupled with a gate of transistor 212 and a second output of pre-driver 202 being coupled with a gate of transistor 210. In some embodiments, a second pre-driver 204 drives feed-through capacitors 220 and 222, with a first output of pre-driver 204 being coupled with a first terminal of capacitor 222 and a second output of pre-driver 204 being coupled with a first terminal of capacitor 220. As shown in FIG. 2, a second terminal of capacitor 220 is coupled with the drain terminal of transistor 212, load resistor 230, a first output with parasitic capacitance 224; and similarly a second terminal of capacitor 222 is coupled with the drain terminal of transistor 210, load resistor 232, and a second output with parasitic capacitance 226. Current source 240 is coupled with the source terminal of each of differential pair transistors 210 and 212. As referred to herein, driver 200 is a separate feed-through capacitance line driver.

While the feed-through capacitors in the figures, such as capacitors 220 and 222 in FIG. 2, are illustrated as being separate from the feed-through capacitance pre-driver, such as pre-driver 204 in FIG. 2, in some embodiments the feed-through capacitors may be included as a part of the pre-driver, thereby simplifying the matching of components in a driver.

Figure 3:
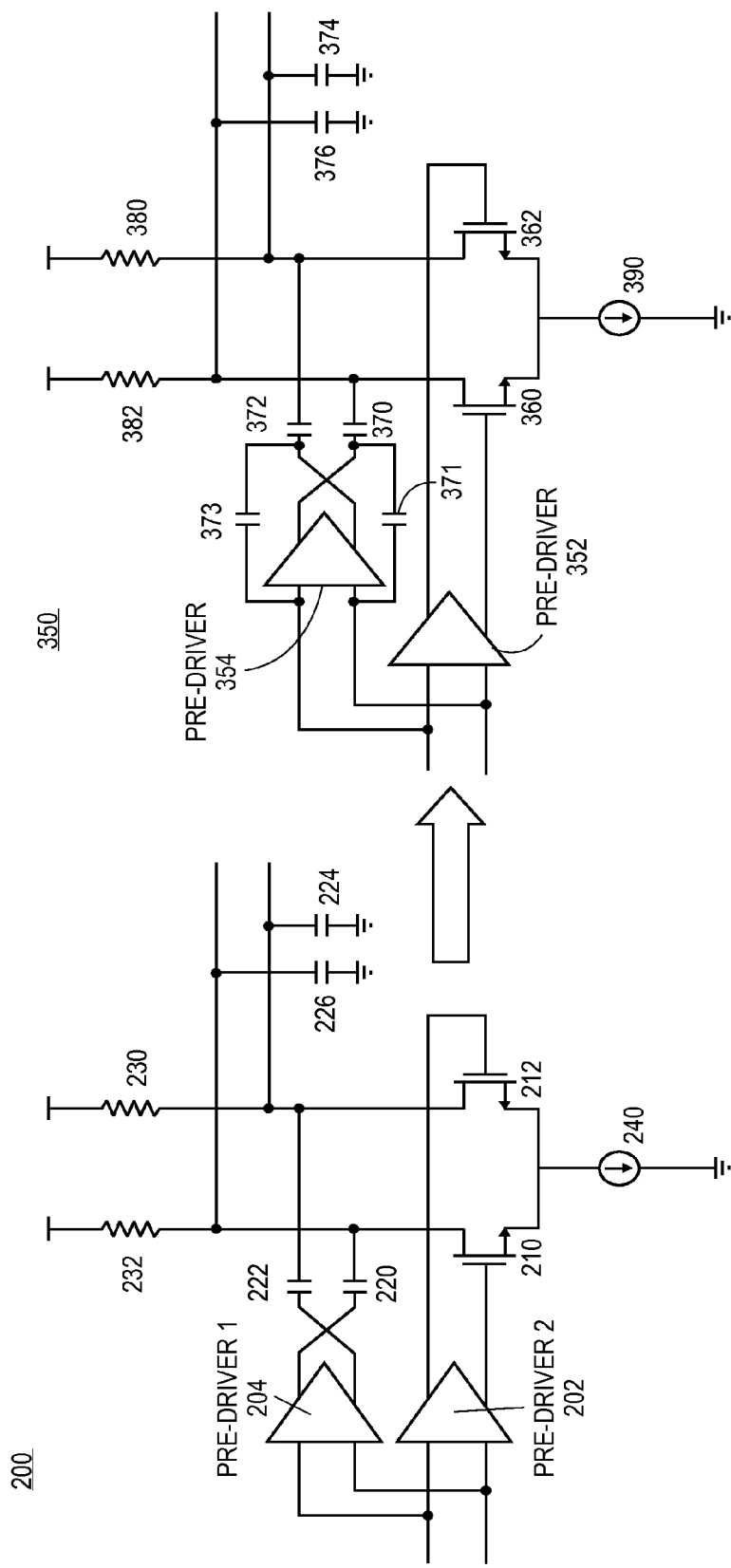
FIG. 3 illustrates embodiments of feed-through capacitance drivers.

The feed-through capacitors provide significant loading for the pre-driver. In some embodiments, the separate feed-through capacitance driver may be modified to provide increased driving capacity. FIG. 3 illustrates embodiments of feed-through capacitance drivers. Driver 200 is a reproduction of the separate feed-through capacitance driver 200 illustrated in FIG. 2. In some embodiments, a driver is modified as illustrated as driver 350, which may be referred to as a cascade feed-through capacitance driver.

In some embodiments, driver circuit 350 includes a first pre-driver 352 driving a differential signal into the gates of differential pair transistors 360 and 362, the transistors in this implementation being NMOS transistors, with a first output of pre-driver 352 being coupled with a gate of transistor 362 and a second output of pre-driver 352 being coupled with a gate of transistor 360. In some embodiments, a second pre-driver 354 drives feed-through capacitors 370 and 372, with a first output of pre-driver 354 being coupled with a first terminal of capacitor 372 and a second output of pre-driver 354 being coupled with a first terminal of capacitor 370. In some embodiments, the driver 350 further includes capacitor 373 coupled between the first input and the second output of pre-driver 354, and capacitor 371 coupled between the second input and the first output of pre-driver 354.

As shown, a second terminal of capacitor 370 is coupled with the drain terminal of transistor 362, load resistor 380, and a first output with parasitic capacitance 374; and similarly a second terminal of capacitor 372 is coupled with the drain terminal of transistor 360, load resistor 382, and a second output with parasitic capacitance 376. Current source 390 is coupled with the source terminal of each of differential pair transistors 360 and 362. As referred to herein, driver 350 is a cascade feed-through capacitance driver.

In some embodiments, a line driver utilizes a modified timing-controlled cascade feed-through technique. Because separate pre-drivers are used to drive the feed-through capacitor and differential pair respectively, a first pre-driver operating to drive the differential pair and a second pre-driver to drive the feed-through capacitors, the driver circuit allows switching the pre-drivers at different times. In some embodiments, a time when the second pre-driver drives the feed-through capacitors could be earlier or later than the time when the pre-driver drives the differential pair. Further, this switching may happen at the same time depending on the different situations and performance requirements.

In some embodiments, a timing control apparatus and method provides control of the timing of the clock/data edge. In some embodiments, a delay may be implemented to delay the rising and falling edges of a signal input. In some embodiments, the rising edge and falling edge of the feed-through capacitance inputs are delayed by a time $\Delta t$ from that of the differential-pair input. In some embodiments, the time $\Delta t$ is approximately equal to (or is a small amount larger than) half of the transition time of the differential-pair input.

Thus, if $t_r$ is rise time of a differential input signal, then the delay time may be as follows:

$$\Delta t \approx 0.5 * t_r \quad [1]$$

However, embodiments are not limited to this value of $\Delta t$. As illustrated and discussed herein, a delay $\Delta t$ for the rising edge may be shown to be the same as a delay for the falling. However, it is not necessary for the timing schemes of the rising edge and the falling edge to be the same, and embodiments are not limited to such operation. In some embodiments, a $\Delta t$ for the rising edge is different that a $\Delta t$ for a falling edge.

Figure 4:
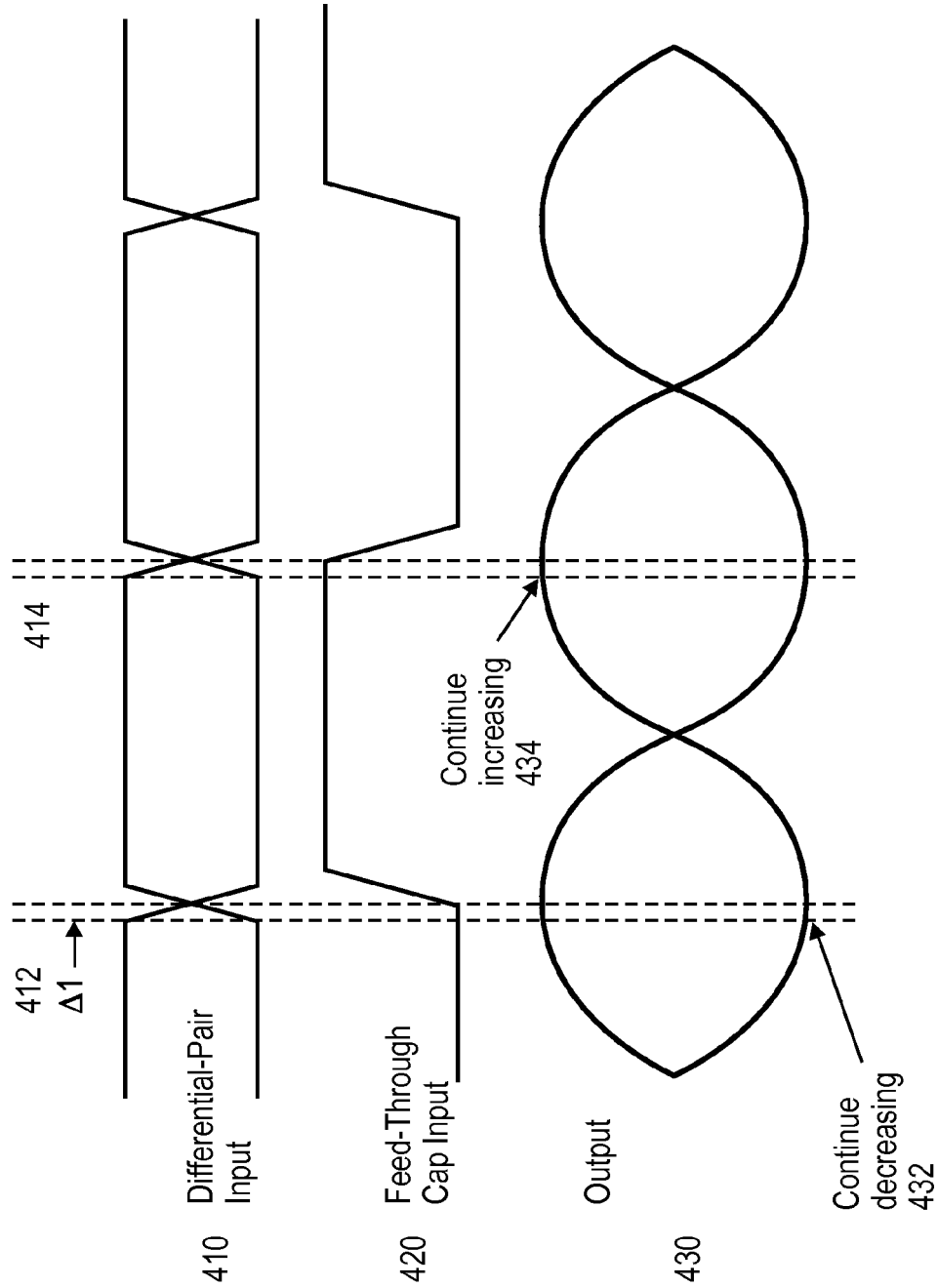
FIG. 4 is an illustration of timing of a feed-through line driver according to an embodiment.

FIG. 4 is an illustration of timing of a feed-through line driver according to an embodiment. In this illustration, a differential-pair input signal 410 (wherein the differential pair transistors may be referred to as transistor M1 and transistor M2) and a feed-through capacitor input signal 420 are shown, together with an output signal 430. In the rising edge case, when the differential-pair input signal 410 begins to rise, indicating an increasing gate voltage for the differential pair transistors illustrated in FIG. 2 and FIG. 3, the output voltage continues decreasing 432 for a certain amount of time until the differential-pair input crosses its middle voltage. Because the transistor M1 is still "OFF" and the transistor M2 is still "ON" at the time of the switching of the differential pair input 410, it is not useful to trigger the feed-through capacitor portion of the driver at this moment, which will operate to decrease the eye-diagram swing.

In some embodiments, a delay 412 is imposed on the feed-through capacitor input 420 in comparison with the differential pair input 410, whereby the delay 412 is chosen to allow the output to reach a point where such output is increasing. In some embodiments, a target time to trigger the feed-through capacitor input is when the differential-pair input has arrived at its middle voltage, and the output voltage begins to increase, which further indicates that triggering of the signal driving for the feed-through capacitor input signal does not occur until M1 is "ON" and M2 is "OFF".

In the falling edge case, when the differential-pair input signal 410 begins to fall, indicating an decreasing gate voltage for the differential pair, the output voltage continues increasing 434 for a certain amount of time until the differential-pair input crosses its middle voltage.

In some embodiments, a delay 414 is imposed on the feed-through capacitor input 420 in comparison with the differential pair input 410, whereby the delay 414 is chosen to allow the output to reach a point where such output is increasing. In some embodiments, a target time to trigger the feed-through capacitor input is when the differential-pair input has arrived at its middle voltage, and the output voltage begins to increase. In general, a delay is provided such that the current flowing in the differential-pair does not counteract the current pulse (or charge pulse) brought by the feed-through scheme.

Figure 5:
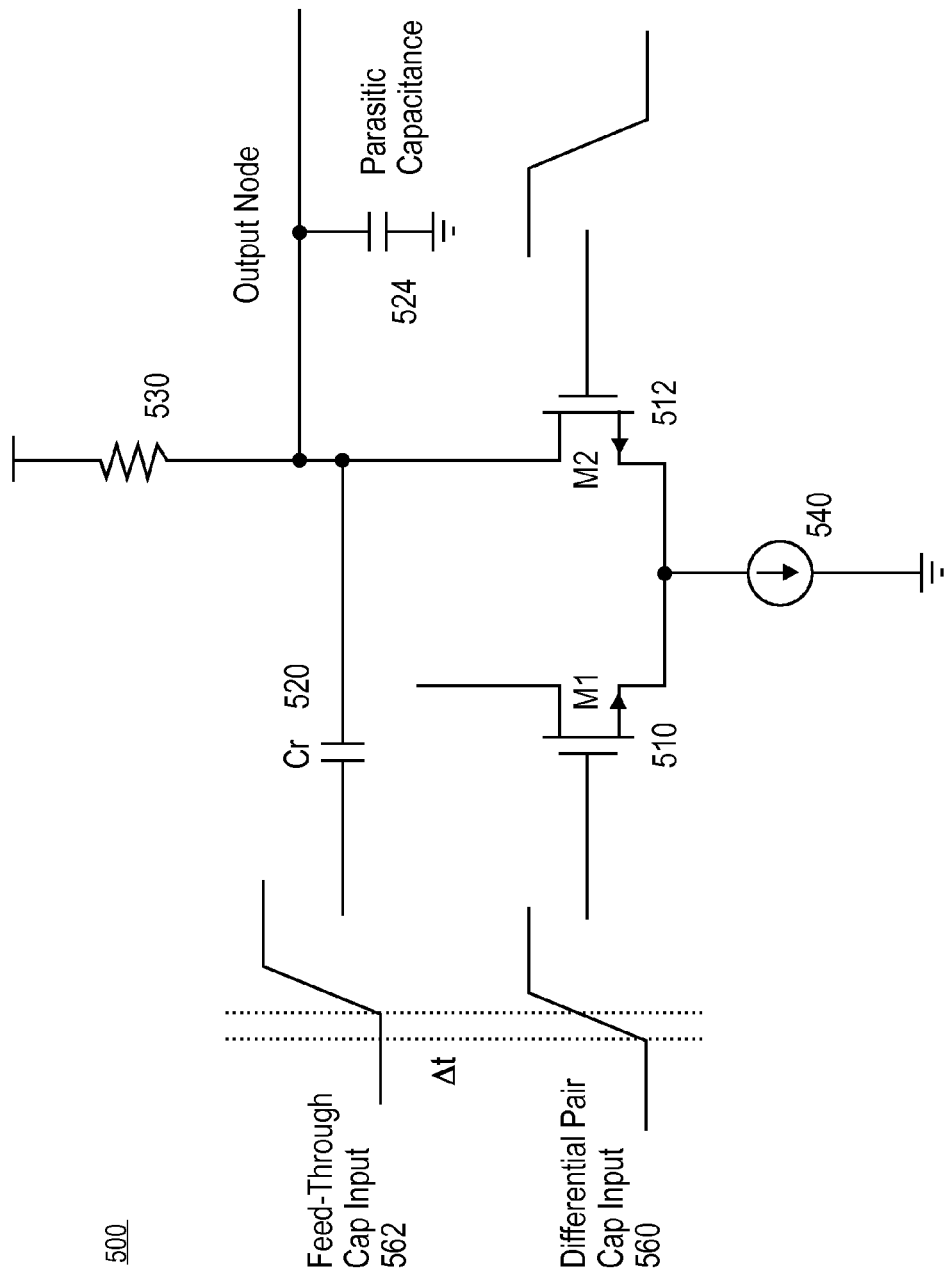
FIG. 5 illustrates an input signal of a feed-through capacitance driver according to an embodiment.

FIG. 5 illustrates an input signal of a feed-through capacitance driver according to an embodiment. In this illustration, a simplified driver is illustrated as including differential pair transistors 510 and 512, feed-through capacitor 520, load 530, current source 540, and parasitic capacitance 524 of an output node, with the remaining elements of the driver being omitted from the illustration. As shown in FIG. 5, a rising edge differential-pair input 560 is supplied to the differential pain input, and a feed-through capacitance input 562 is supplied to the feed-through capacitor 520. In some embodiments, the feed-through capacitance input 562 is delayed by a time period of Δt in relation to the differential-pair input 560, where the time period Δt is chosen such that the differential-pair input has reached a middle voltage, or half-way point, in the transition between signal values.

Figure 6:
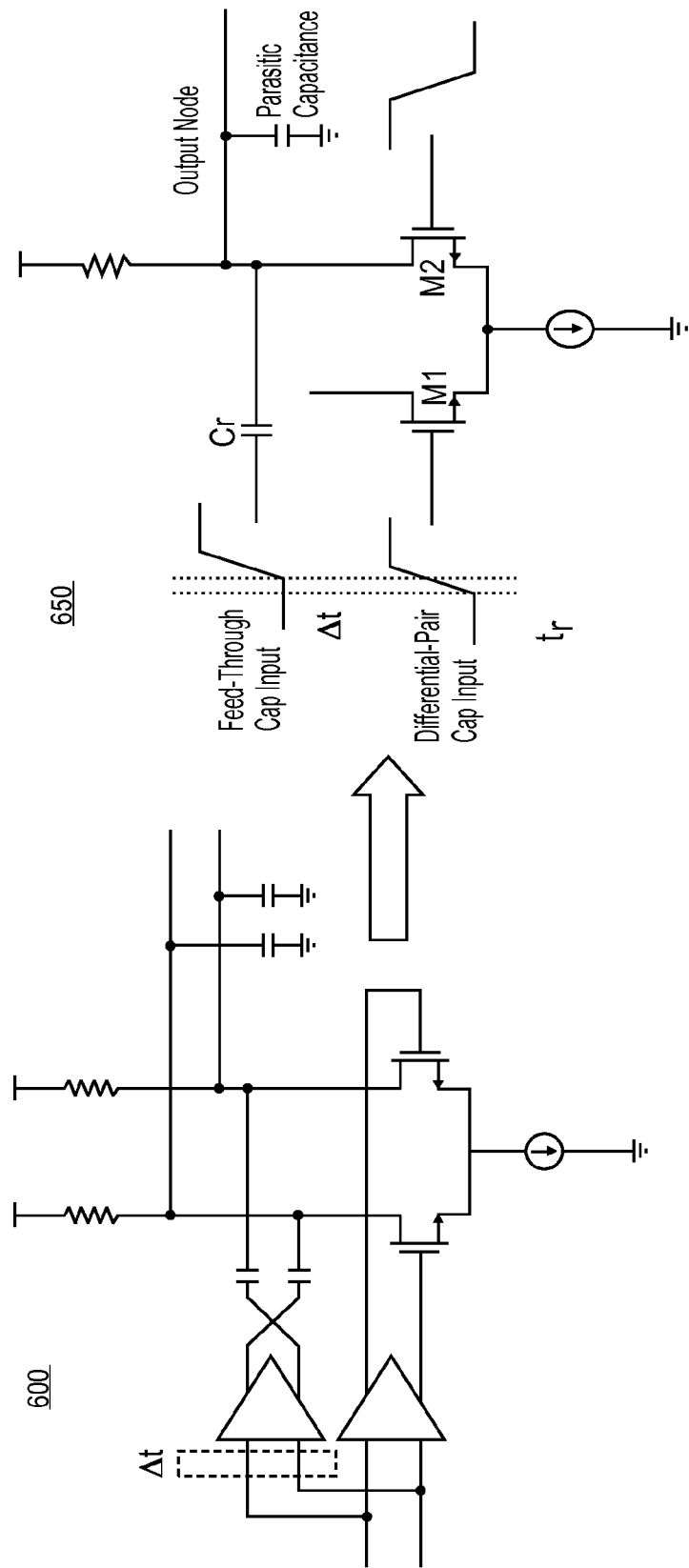
FIG. 6 illustrates the imposition of a delay in a signal of a feed-through capacitance driver according to an embodiment.

FIG. 6 illustrates the imposition of a delay in a signal of a feed-through capacitance driver according to an embodiment. In this illustration, a feed-through capacitance driver 600, such as the embodiment of a feed-through capacitance driver 200 illustrated in FIG. 2. In some embodiments, a delay Δt is imposed at the input of the pre-driver that is driving the input signal for the feed-through capacitors, such as pre-driver 204 illustrated in FIG. 2. In some embodiments, the imposition of the delay Δt results in the delay in the feed-through capacitance signal input as shown for simplified driver 650, which is a reproduction of driver 500 illustrated in FIG. 5.

Figure 7:
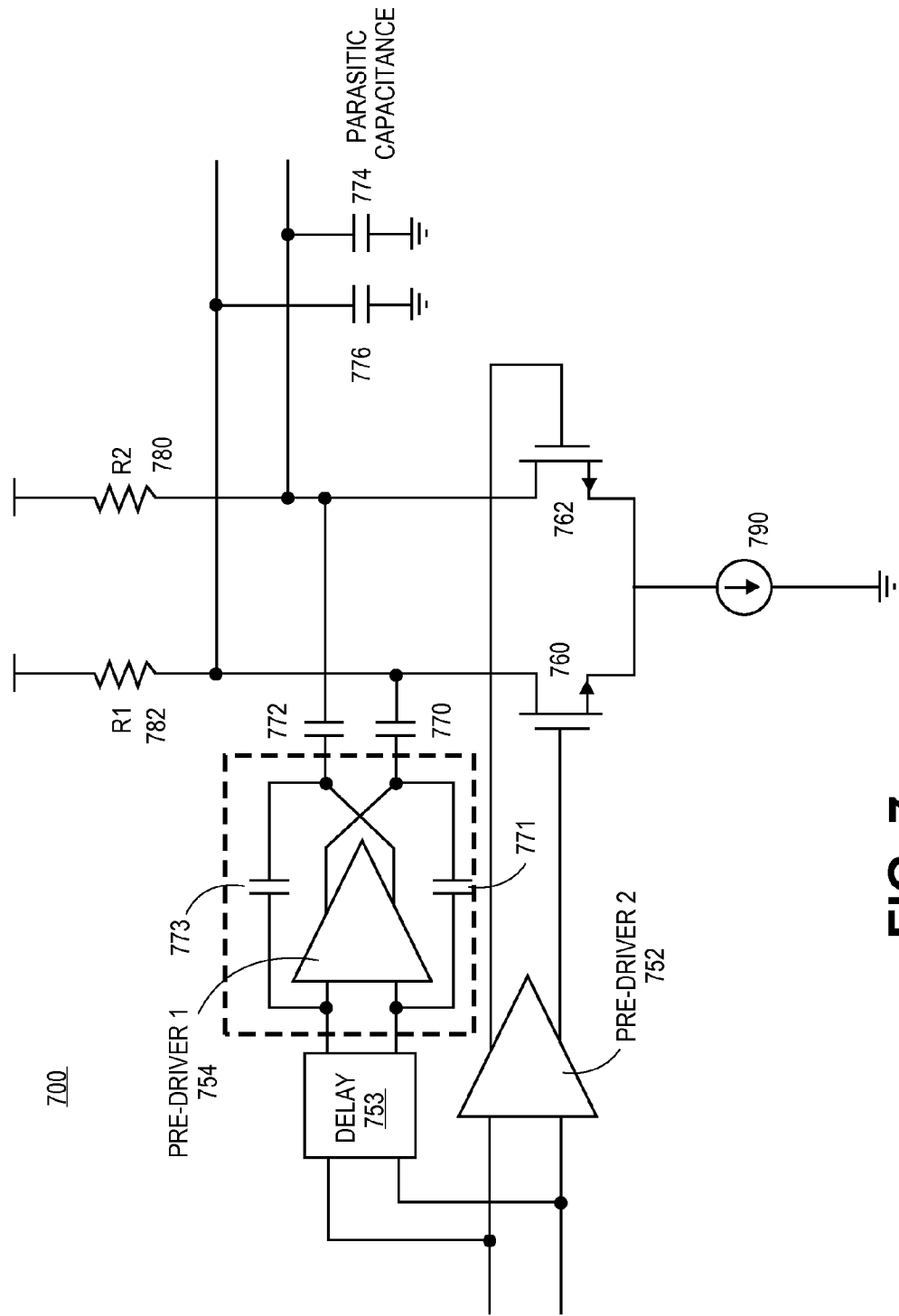
FIG. 7 illustrates an embodiment of a cascade feed-through capacitance driver with input delay.

FIG. 7 illustrates an embodiment of a cascade feed-through capacitance driver with input delay. In some embodiments, a cascade feed-through capacitance driver 700 includes a first pre-driver 752 driving a differential signal into the gates of differential pair transistors 760 and 762, the transistors in this implementation being NMOS transistors, with a first output of pre-driver 752 being coupled with a gate of transistor 762 and a second output of pre-driver 752 being coupled with a gate of transistor 760. In some embodiments, a second pre-driver 754 drives feed-through capacitors 770 and 772, with a first output of pre-driver 754 being coupled with a first terminal of capacitor 772 and a second output of pre-driver 754 being coupled with a first terminal of capacitor 770. In some embodiments, the driver 700 further includes capacitor 773 coupled between the first input and the second output of pre-driver 754, and capacitor 771 coupled between the second input and the first output of pre-driver 754.

As shown, a second terminal of capacitor 770 is coupled with the drain terminal of transistor 762, load resistor 780, and a first output with parasitic capacitance 774; and similarly a second terminal of capacitor 772 is coupled with the drain terminal of transistor 760, load resistor 782, and a second output with parasitic capacitance 776. Current source 790 is coupled with the source terminal of each of differential pair transistors 760 and 762.

In some embodiments, the driver 700 further includes a delay element mechanism, whereby the delay mechanism 753 delays the input signal to the pre-driver 754 by a certain time period. The delay element may include any delay structure that can provide a delay of the input signal to pre-driver 754 a point in time where the signal input to pre-driver 752 has reached a middle voltage in a transition between signal values. In an example, a Δt delay may be implemented by inserting inverters in the input lines to the feed-through capacitance pre-driver 754. In another example, a delay may be imposed by a variable length delay that is set to a desired delay value. In some embodiments, the delay mechanism may provide varying delays, including, for example, a first delay for a rising edge signal and a second delay for a falling edge signal.

Figure 8:
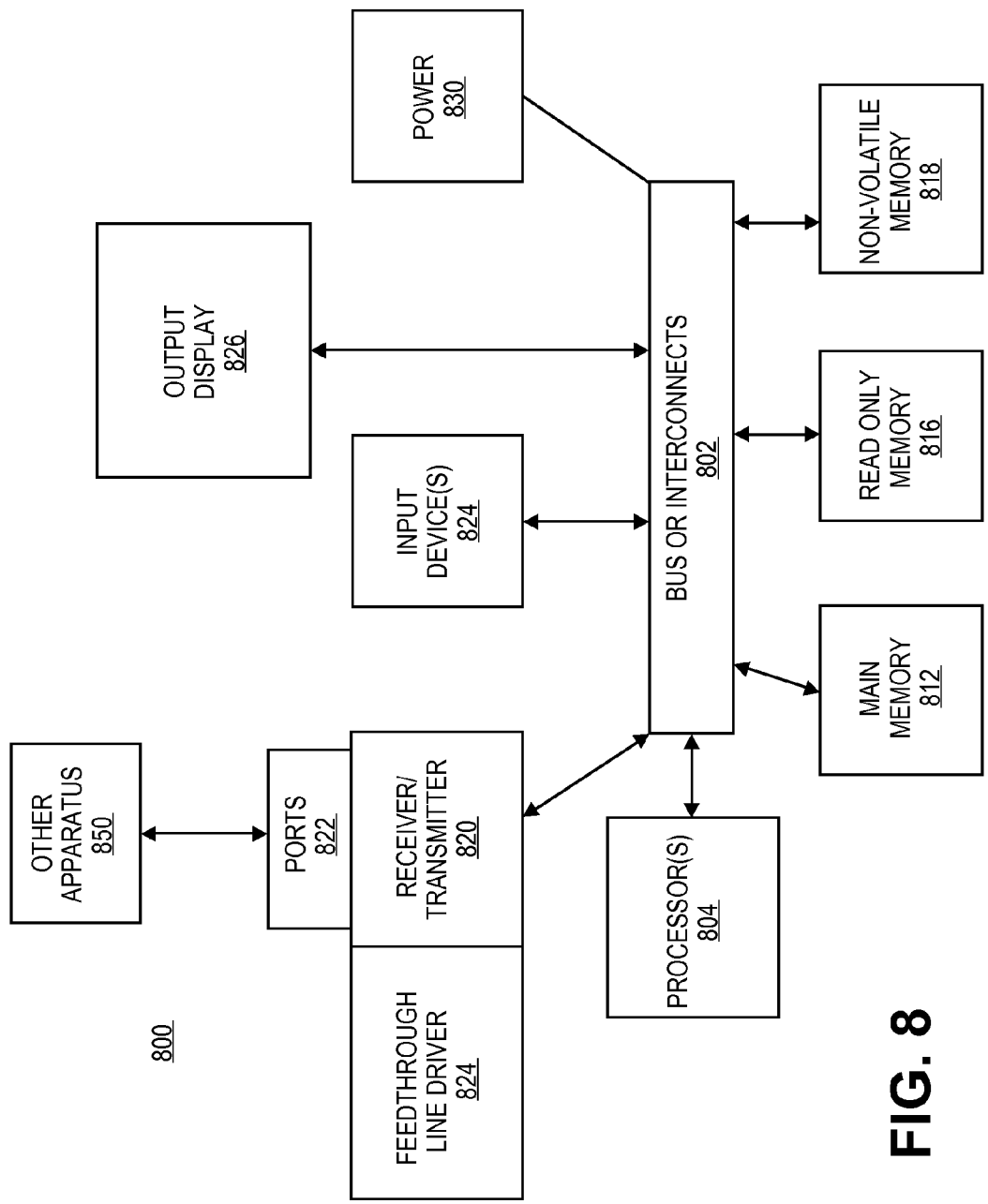
FIG. 8 is an illustration of an apparatus or system for transmitting or receiving data utilizing a feed-through line driver according to an embodiment.

FIG. 8 is an illustration of an apparatus or system for transmitting or receiving data utilizing a feed-through line driver according to an embodiment. In some embodiments, the apparatus or system includes a feed-through line driver with a separate pre-driver for feed-through capacitance.

In some embodiments, an apparatus or system 800 (referred to here generally as an apparatus) comprises an interconnect or crossbar 802 or other communication means for transmission of data. In some embodiments, one or more transmitters or receivers 820 may be coupled to the interconnect 802. In some embodiments, the receivers or transmitters 820 may include one or more ports 822 for the connection of other apparatuses, such as the illustrated 850. In some embodiments, a transmitter may include a feed-through line driver for driving a signal on a serial interface, the driver including a separate pre-driver for feed-through capacitance. In some embodiments, the driver may include a driver such as illustrated in FIG. 2, 3, or 7. In some embodiments, the driver may include a delay mechanism to provide time control for the driving of signals for the feed-through capacitance, including, for example, delay mechanism 753 illustrated in FIG. 7.

The apparatus 800 may also include the following elements:

The apparatus 800 may include a processing means such as one or more processors 804 coupled with the interconnect 802 for processing information. The processors 804 may comprise one or more physical processors and one or more logical processors. The interconnect 802 is illustrated as a single interconnect for simplicity, but may represent multiple different interconnects or buses and the component connections to such interconnects may vary. The interconnect 802 shown in FIG. 8 is an abstraction that represents any one or more separate physical buses, point-to-point connections, or both connected by appropriate bridges, adapters, or controllers.

The apparatus 800 further comprises a random access memory (RAM) or other dynamic storage device or element as a main memory 812 for storing information and instructions to be executed by the processors 804. In some embodiments, main memory 812 may include active storage of applications for use of the apparatus 800. In some embodiments, memory of the apparatus may include certain registers or other special purpose memory.

The apparatus 800 also may comprise a read only memory (ROM) 816 or other static storage device for storing static information and instructions for the processors 804. The apparatus 800 may include one or more non-volatile memory elements 818 for the storage of certain elements, including, for example, flash memory and a hard disk or solid-state drive.

The apparatus may include one or more input devices 824, including, but not limited to, a remote control; a set of switches and buttons to provide input; a mouse or other pointing device; a keyboard; a voice recognition system; or a gesture recognition system.

The apparatus 800 may also be coupled via the interconnect 802 to an output display 826. In some embodiments, the display 826 may include a liquid crystal display (LCD) or any other display technology, for displaying information or content to a user, including three-dimensional (3D) displays. In some environments, the display 826 may include a touchscreen that is also utilized as at least a part of an input device. In some environments, the display 826 may be or may include an audio device, such as a speaker for providing audio information The apparatus 800 may also comprise a power device or apparatus 830, which may comprise a power supply, a battery, a solar cell, a fuel cell, or other system or device for providing or generating power. The power provided by the power device or system 830 may be distributed as required to elements of the apparatus 800.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable non-transitory storage medium having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

What is claimed is:

1. An apparatus comprising:
    a differential pair of transistors to generate an output signal on a first output node and a second output node, the differential pair including a first transistor including an output terminal coupled with the first output node and a second transistor including an output terminal coupled with the second output node;
    a first pass-through capacitor having a first terminal coupled with the second output node;
    a second pass-through capacitor having a first terminal coupled with the first output node;
    a first pre-driver configured to drive an input signal for the differential pair of transistors, the first pre-driver including a first input to receive a first signal component of a differential input signal and a second input to receive a second signal component of the differential input signal, and including a first output coupled with an input terminal of the first transistor and a second output coupled with an input terminal of the second transistor; and
    a second pre-driver including a first output and a second output, the first output of the second pre-driver coupled to a second terminal of the first pass-through capacitor, the second output of the second pre-driver coupled to a second terminal of the second pass-through capacitor, the second pre-driver further including a first input to receive the first signal component and a second input to receive the second signal component.

2. The apparatus of claim 1, further comprising a third pass-through capacitor coupled between the first input of the second pre-driver and the second output of the second pre-driver, and a fourth pass-through capacitor coupled between the second input of the second pre-driver and the first output of the second pre-driver.

3. The apparatus of claim 1, wherein the first and second pass-through capacitors are part of the second pre-driver.

4. The apparatus of claim 1, further comprising a delay mechanism to delay the input signal to the first and second inputs of the second pre-driver by a time delay.

5. The apparatus of claim 4, wherein the time delay is an amount of time that is sufficient for a voltage of a component of the input signal to reach a midpoint in a transition between signal values.

6. The apparatus of claim 4, wherein the delay mechanism provides a first time delay for a rising edge signal and a second time delay for a falling edge signal.

7. The apparatus of claim 6, wherein the first time delay and the second time delay are different values.

8. A method comprising:
 receiving a first signal component of a differential input signal at a first input of a first pre-driver;
 receiving a second signal component of the differential input signal at a second input of the first pre-driver;
 driving a signal for a differential pair of transistors with a first pre-driver based on the first signal component and the second signal component by providing a first output to an input terminal of the first transistor and a second output to an input terminal of the second transistor;
 receiving the first signal component of the differential input signal at a first input of a second pre-driver;
 receiving the second signal component of the differential input signal at a second input of the second pre-driver;
 driving an input signal for a first pass-through capacitor with the second pre-driver based on the first signal component and the second signal component of the differential input signal;
 driving an input signal for a second pass-through capacitor with the second pre-driver based on the first signal component and the second signal component of the differential input signal; and
 generating an output signal on a first output node and a second output node by providing the first output and the second output to control the differential pair of transistors and adjusting voltage levels at the first and second output nodes by the first and second pass-through capacitors.

9. The method of claim 8, further comprising:
 coupling the first input of the second pre-driver to the second input of the second pre-driver via a third pass-through capacitor; and
 coupling the second input of the second pre-driver to the first input of the second pre-driver via a fourth pass-through capacitor.

10. The method of claim 8, wherein the first and second pass-through capacitors are part of the second pre-driver.

11. The method of claim 8, further comprising delaying the input signal to the first and second inputs of the second pre-driver by a time delay.

12. The method of claim 11, wherein the time delay is an amount of time that is sufficient for a voltage of a component of the input signal to reach a midpoint in a transition between signal values.

13. The method of claim 11, wherein delaying the input signal includes providing a first time delay for a rising edge signal and a second time delay for a falling edge signal.

14. The method of claim 13, wherein the first time delay and the second time delay are different values.

15. A non-transitory computer readable storage medium comprising a digital representation of a feed-through line driver, the feed-through line driver comprising:
 a differential pair of transistors to generate an output signal on a first output node and a second output node, the differential pair including a first transistor including an output terminal coupled with the first output node and a second transistor including an output terminal coupled with the second output node;
 a first pass-through capacitor having a first terminal coupled with the second output node;
 a second pass-through capacitor having a first terminal coupled with the first output node and the second output node;
 a first pre-driver configured to drive an input signal for the differential pair of transistors, the first pre-driver including a first input to receive a first signal component of a differential input signal and a second input to receive a second signal component of the differential input signal, and including a first output coupled with an input terminal of the first transistor and a second output coupled with an input terminal of the second transistor; and
 a second pre-driver including a first output and a second output, the first output of the second pre-driver coupled to a second terminal of the first pass-through capacitor, the second output of the second pre-driver coupled to a second terminal of the second pass-through capacitor, the second pre-driver further including a first input to receive the first signal component and a second input to receive the second signal component.

16. The non-transitory computer readable storage medium system of claim 15, further comprising a third pass-through capacitor coupled between the first input of the second pre-driver and the second output of the second pre-driver, and a fourth pass-through capacitor coupled between the second input of the second pre-driver and the first output of the second pre-driver.

17. The non-transitory computer readable storage medium of claim 15, wherein the first and second pass-through capacitors are part of the second pre-driver.

18. The non-transitory computer readable storage medium of claim 15, wherein the feed-through line driver further comprises a delay mechanism to delay the input signal to the first and second inputs of the second pre-driver by a time delay.

* * * * *